(12) United States Patent
Gherman et al.

(10) Patent No.: US 10,650,879 B2
(45) Date of Patent: May 12, 2020

(54) DEVICE AND METHOD FOR CONTROLLING REFRESH CYCLES OF NON-VOLATILE MEMORIES

(71) Applicant: COMMISSARIAT A L'ENERGIE ATOMIQUE ET AUX ENERGIES ALTERNATIVES, Paris (FR)

(72) Inventors: Valentin Gherman, Palaiseau (FR); Marcelino Seif, Les Ulis (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/328,886

(22) PCT Filed: Aug. 30, 2017

(86) PCT No.: PCT/EP2017/071749
§ 371 (c)(1),
(2) Date: Feb. 27, 2019

(87) PCT Pub. No.: WO2018/041885
PCT Pub. Date: Mar. 8, 2018

(65) Prior Publication Data
US 2019/0221253 A1  Jul. 18, 2019

(30) Foreign Application Priority Data
Sep. 1, 2016 (FR) ...................... 16 58135

(51) Int. Cl.
*G11C 11/40* (2006.01)
*G11C 11/406* (2006.01)
*G11C 16/34* (2006.01)
*G11C 7/04* (2006.01)
*G11C 13/00* (2006.01)
(Continued)

(52) U.S. Cl.
CPC ...... *G11C 11/40626* (2013.01); *G06F 3/0619* (2013.01); *G06F 3/0652* (2013.01); *G06F 3/0679* (2013.01); *G11C 7/04* (2013.01); *G11C 13/0033* (2013.01); *G11C 16/32* (2013.01); *G11C 16/349* (2013.01); *G11C 16/3418* (2013.01); *G11C 16/3431* (2013.01); *G11C 16/3495* (2013.01); *G06F 11/3037* (2013.01); *G06F 11/3058* (2013.01)

(58) Field of Classification Search
None
See application file for complete search history.

(56) References Cited

U.S. PATENT DOCUMENTS 6,169,442 B1   1/2001  Meehan et al.
7,158,422 B2 *  1/2007  Choi ................... G06F 13/1689
                                      365/189.03
(Continued)

Primary Examiner — Tan T. Nguyen
(74) Attorney, Agent, or Firm — Baker & Hostetler LLP

(57) ABSTRACT

A device for controlling the refresh cycles of data stored in a non-volatile memory is provided. The device comprises a temperature sensor capable of measuring the temperature of at least one non-volatile memory and of delivering information representing the measured temperature, and a control module coupled to the temperature sensor capable of using the temperature information with modelling of the impact of the temperature on the retention time of the data in order to determine whether a loss of data is imminent and, if so, in order to generate an alarm.

13 Claims, 5 Drawing Sheets

(51) Int. Cl.
  *G06F 3/06* (2006.01)
  *G11C 16/32* (2006.01)
  *G06F 11/30* (2006.01)

(56) References Cited

U.S. PATENT DOCUMENTS

| | | |
|---|---|---|
| 9,165,668 B1 | 10/2015 | Zhao et al. |
| 2003/0156483 A1* | 8/2003 | Feurle ................ G11C 7/04 |
| | | 365/222 |
| 2005/0185491 A1* | 8/2005 | Kim ................ G11C 11/406 |
| | | 365/222 |
| 2007/0211548 A1 | 9/2007 | Jain et al. |
| 2010/0110793 A1 | 5/2010 | Kim et al. |
| 2012/0268995 A1 | 10/2012 | Sugimoto et al. |
| 2013/0301371 A1* | 11/2013 | Chen ................ G11C 11/40615 |
| | | 365/222 |
| 2014/0101371 A1 | 4/2014 | Nguyen et al. |
| 2014/0325165 A1 | 10/2014 | Kobayashi et al. |
| 2015/0094995 A1 | 4/2015 | Allen-Ware et al. |

\* cited by examiner

DEVICE AND METHOD FOR CONTROLLING REFRESH CYCLES OF NON-VOLATILE MEMORIES

CROSS-REFERENCE TO RELATED APPLICATIONS

This application is a National Stage of International patent application PCT/EP2017/071749, filed on Aug. 30, 2017, which claims priority to foreign French patent application No. FR 1658135, filed on Sep. 1, 2016, the disclosures of which are incorporated by reference in their entirety.

FIELD OF THE INVENTION

The invention relates to the field of memories and in particular relates to retention time and to refresh cycles of data stored in non-volatile memories.

BACKGROUND

Flash memories are rewritable non-volatile memories (MNV), whose stored data do not disappear when the power is switched off. The high speed, the lifetime and the low consumption of this type of memory render it attractive for numerous uses for example in digital stills cameras, cellular telephones, printers, personal assistants (PDA), laptop computers or sound readout and recording devices such as digital personal stereos, USB keys.

Electronic disks known by the name (SSD) disks, standing for "Solid-State Drive" in English, intended to replace traditional hard disks known by the name (HDD) disk, standing for "Hard-Disk Drive" in English, are static storage units. Some SSDs use flash memories of (MLC) type, standing for "Multi Level Cell" in English, to store 2 bits per memory cell or of (TLC) type, standing for "Triple Level Cell" in English, to store 3 bits per memory cell in place of 1 bit per memory cell as in the flash memories of (SLC) type, standing for "Single Level Cell" in English. The increase in the number of bits per cell is one of the means for reducing the difference in price per gigabyte (GB) between SSDs and hard disks HDDs, to exploit the advantages of SSDs with respect to HDDs in terms of performance, consumption and resistance to knocks.

However, a point of weakness of flash memories is that the retention time of the data stored in the memory cells, the time corresponding to the longest period of data preservation, is impacted by the temperature prevailing in the memory. This phenomenon is augmented in the case where more than one bit is stored per cell. Certain MLC memories may have a guaranteed end-of-life retention time of two months at 40° C. This time, by applying the Arrhenius law, which predicts an exponential increase in retention time with temperature, is equivalent to a retention time of two days at 70° C. However, an SSD with a sizable workload can reasonably reach such a temperature, even in a controlled temperature environment such as a datacenter.

To curb the effects of the reduction in retention time, it is known to undertake periodic refreshing of the data. This refreshing can be executed without changing the place where the data are stored, by injecting just the quantity of charge which is lacking on the floating gate of the memory cells and one then speaks of in situ refreshing, or alternatively the refreshing can be undertaken by rewriting the data to a different address by reprogramming. In situ refreshing is manifested by a lesser impact on energy consumption and on response speed, and it has, virtually, no impact on the endurance to the P/E cycles.

The endurance of a flash memory which is generally measured as number of guaranteed Programming/Erasure (P/E) cycles, is reduced by a decade on average for each additional bit stored in the memory cells. This impact may be mitigated by relaxing the upper limit of the number of guaranteed P/E cycles, but this is achieved to the detriment of the guaranteed retention time.

Because of this mutual interdependency between the endurance and the retention time of flash memories, the solutions involving periodic refreshing of the data can also be used to improve the endurance of memories. This can be implemented by increasing the maximum number of P/E cycles allowed on a flash memory while mitigating the impact of this increase by periodic refreshing.

The drawback remains that in the presence of temperature variations which may be due to a change of environmental conditions and/or due to the workload of the memory, fixed-frequency refreshing may entail sizable penalties in terms of latency of response, of energy consumption and of available number of P/E cycles.

Hence, the need exists for a solution which alleviates the drawbacks of the known approaches. The present invention attends to this need.

SUMMARY OF THE INVENTION

An object of the present invention is to propose a device to track the evolution of the impact of temperature on the retention time of non-volatile memories.

Another object of the invention is to propose a device to adapt the refreshing frequency of non-volatile memories according to the evolution of the impact of temperature on retention time.

The device of the invention consists in a general manner of a temperature sensor to measure the temperature, of one or more non-volatile memories and of a control module to undertake a tracking of the impact of the evolution of the measured temperature on the data retention time.

In one embodiment, the device of the invention comprises means to generate an alert upon detecting the imminence of a loss of data.

The device of the invention makes it possible to trigger a refreshing of the data in an appropriate manner, related to the imminence of a loss of data, rather than in a systematic and periodic manner. The number of refresh cycles of non-volatile memories is thus significantly decreased.

The present invention will find an advantageous application in all environments making intensive use of non-volatile memories subjected to high temperatures, such as for example the SSDs used in datacenters.

To obtain the sought-after results, a device and a method such as claimed are proposed.

The invention can operate in the form of a program product which comprises code instructions to perform the steps of the claimed method when the program is executed on a micro-processor.

BRIEF DESCRIPTION OF THE DRAWINGS

Various aspects and advantages of the invention will become apparent in support of the description of a preferred but nonlimiting mode of implementation of the invention, with reference to the figures hereinbelow.

DETAILED DESCRIPTION

Figure 1:
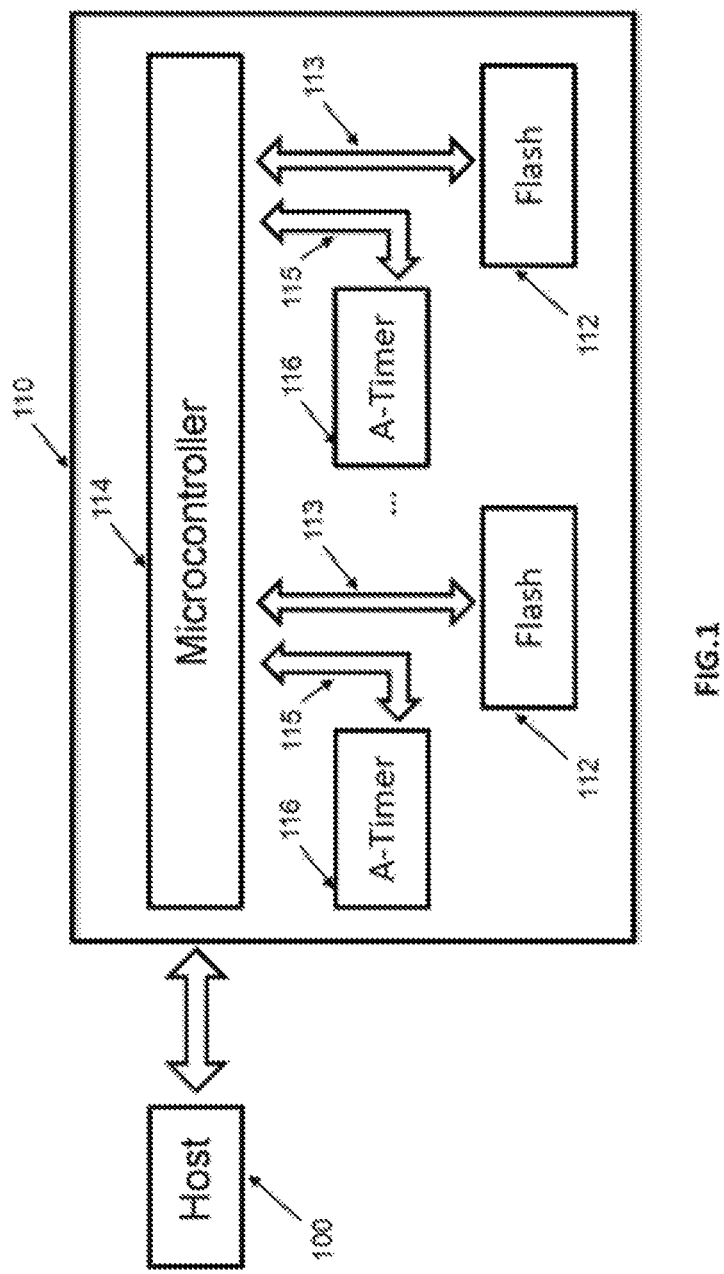
FIG. 1 is a block diagram of a host-SSD disk or memory card communication system to implement the device of the invention.

Reference is made in FIG. 1 which shows in a schematic manner a system for communication between a host 100 and an SSD disk or a memory card 110. In the example described, the SSD disk 110 is represented as comprising a plurality of flash memories 112. In a variant implementation, a single flash memory is connected to a host. The card 110 comprises connection interfaces for connecting with the host. In a manner well known to the person skilled in the art, such interfaces for external cards (not shown) may be connectors of (USB) type standing for "Universal System Bus" in English or else of (SATA) type standing for "Serial Advanced Technology Attachment" in English. The memory card 110 can thus connect via the connector to the corresponding interface of the host 100 in order to exchange data according to various protocols, such as the USB or SATA protocols or other more specific protocols of the host. In a variant, the memory card 110 can be an embedded card of a host system, the host being to accommodate one or more memory cards. According to another mode of implementation, the host 100 and the memory card 110 are in wireless communication and exchange according to (Wi-Fi) protocols standing for "Wireless Fidelity" in English.

The host may be any system which can use a memory card, an SSD disk or can exchange data with a flash memory. Thus, without constituting a limitation, the host 100 can be a fixed or portable personal computer, including tablets, mobile telephones, Smartphones or other personal assistants. The host may also be a server and comprise receptacles for accommodating one or more memory cards or SSD disks.

The SSD disk 110 comprises a control circuit 114 comprising components well known to the person skilled in the art to manage the exchanges of data and instructions between the flash memories 112 and the host 100 via the host/memories communication interfaces, to manage the operations for reading/writing and refreshing the data in the flash memories. The controller 114 is coupled to the flash memories 112 via communication buses or channels 113, a bus possibly being connected to several flash memories. The flash memories 112 can be memories of SLC and/or MLC and/or TLC type.

In one embodiment, the set of components of the control circuit 114 can be implemented as a dedicated module such as an (ASIC) standing for "Application Specific Integrated Circuit" in English.

According to the invention, the SSD disk 110 comprises at least one device 116, designated hereinafter "A-Timer", to track the impact of the temperature of the SSD disk 110 on the retention time in the flash memories. In the example described in FIG. 1, an A-Timer device 116 is associated with each flash memory.

In a variant implementation, a single A-Timer device 116 can be associated with a set of flash memories which are coupled by one and the same communication bus and which exhibit a homogeneous distribution of their internal temperature.

According to another variant, when the temperature is homogeneous across all the flash memories, the SSD disk 110 can comprise a single A-Timer device 116.

According to one mode of implementation, if the SSD disk 110 exhibits regions where the temperature is different, an A-Timer device 116 is assigned to the group of flash memories situated in each region.

The splitting of the regions on an SSD disk can be done on the basis of preliminary temperature measurements carried out on the disk or be borrowed from a splitting applied on previous versions of the disk 110.

Each A-Timer device 116 communicates with the control circuit 114 via a communication bus 115. The control circuit 114 is responsible for the management of the A-Timer devices and the exchanges with the flash memory or memories respectively associated.

Figure 2:
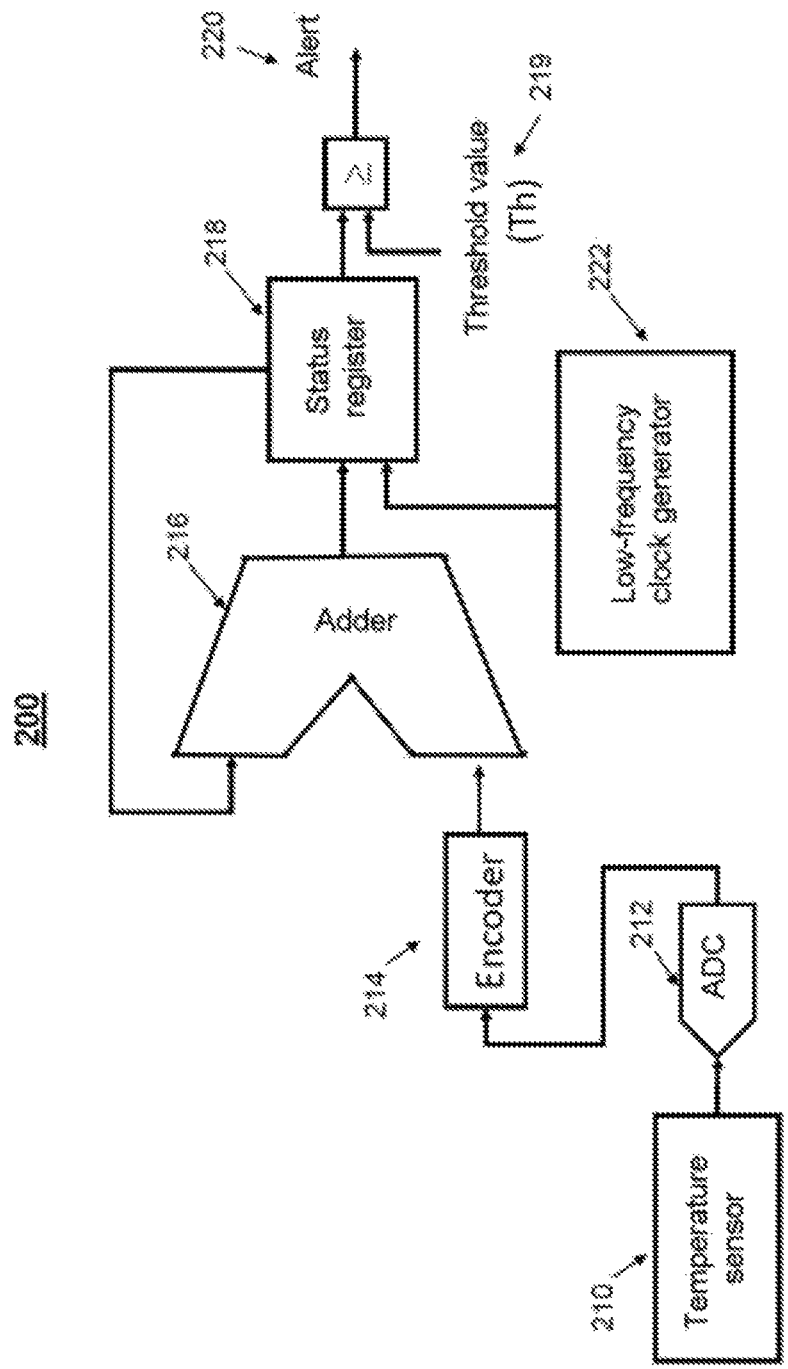
FIG. 2 illustrates a first embodiment of the device of the invention.

FIG. 2 shows a first embodiment of the A-Timer device of the invention. The A-Timer device comprises:

a temperature sensor 210 to measure the temperature of one or more flash memories;

an analog-digital converter (ADC) 212 to transform the signal provided by the temperature sensor into a numerical value;

an encoder 214 to encode the numerical value provided by the ADC into a numerical value which is proportional to the impact of the instantaneous temperature on the retention time of the controlled memories;

an adder 216 to add the numerical value generated by the encoder to a value stored in a status register 218;

a status register 218 to accumulate over time via the adder the values generated by the encoder 214 and to generate an alert signal 220 when the value stored in the status register is increased by an amount which exceeds a predefined threshold (219); and a clock signal generator 222 to regulate the updates of the value stored in the status register.

In a variant implementation, an amplifier (not shown) is connected to the output of the temperature sensor so as to amplify the signal dispatched to the analog-digital converter (ADC) 212.

The temperature sensor 210 makes it possible to measure the temperature of a flash memory or of a group of flash memories to which it is assigned and to generate an electrical signal proportional to the measured temperature. According to a variant, the temperature sensor integrates an analog-digital converter 212 and provides as output a numerical value representative of the measured temperature, which can be used directly by the adder 216 or the encoder 214.

The encoder 214 makes it possible to encode the numerical value provided by the ADC 212 so that it becomes proportional to the impact of the temperature on the retention time of the memories monitored by the device.

In another implementation variant, the analog-digital converter (ADC) 212 provides the input of the adder 216 directly. In this case, it is the ADC 212 which transforms the temperature into the numerical value proportional to the impact of the temperature on the retention time.

According to an implementation, the ADC 212 is a flash or parallel converter, and delivers numerical values in the form of a so-called "thermometer or unary" code according to the following chain: "000 . . . 0", "100 . . . 0", "110 . . . 0", "111 . . . 0", . . . , "111 . . . 1".

Advantageously, according to an implementation, the encoder 214 is adapted to modify the thermometer code so as to deliver values which increase exponentially in a similar manner to the impact of temperature on the retention time of flash memories, such as is described by the model representing the Arrhenius law.

In a preferential manner, the encoder allows so-called "one-hot" encoding as it is referred to in the art, which consists in representing states by using for each state a value whose binary representation has only a single digit 1.

Thus the output of the flash ADC is encoded according to a correspondence given by way of example in the table hereinbelow, where the number of bits at the output of the ADC depends on the number of times that the retention time is divided by two in a temperature interval corresponding to the application:

| ADC 212 | Encoder 214 |
|---------|-------------|
| 000 . . . 0 | 100 . . . 00 |
| 100 . . . 0 | 010 . . . 00 |
| 110 . . . 0 | 001 . . . 00 |
| 111 . . . 0 | 000 . . . 10 |
| . . . | . . . |
| 111 . . . 1 | 000 . . . 01 |

In this implementation, the values output by the encoder 214 which are illustrated in the array hereinabove are obtained by adding the value "1" to the corresponding output of the ADC 212. In this example, the output of the encoder 214 contains one bit more than its input.

The output of the encoder becomes one of the inputs of the adder 216 which also receives as input the last state value stored in the status register 218.

Advantageously, as the values added periodically to the value stored in the status register are proportional to the impact of the instantaneous temperature on the retention time of the flash memories, the state of the status register is proportional to the overall impact of the evolution of the temperature on the retention time.

The state of the status register may be read and used as a time label or "timestamp" as it is referred to in the art, associated with each block or with each page of a flash memory, and corresponding to the last programming/erasure (P/E) operation. The label of a memory block is stored during the first programming after an erasure operation on the block.

The status register 218 is adapted to generate an alert signal 220 each time the value stored in the status register is increased by an amount which exceeds a predefined threshold (219). This threshold corresponds to the minimum retention time of the memory blocks or to a fraction of this time, for example a half or a third.

Thus, the emission of an alert signal 220 by the status register 218 is indicative of the imminence of a loss of data in a flash memory which is monitored by the temperature sensor.

The alert signal is communicated to the microcontroller 114 of the SSD disk 110 which will determine for each memory block whether a data refresh cycle must be performed, as a function of the corresponding time label.

In one embodiment, the storage in the status register 218 can be implemented with two memory technologies simultaneously: a first volatile memory, of DRAM or SRAM type, and a second non-volatile memory, of EEPROM or Flash type.

The volatile memory of the status register 218 is updated in a periodic manner during the operation of the A-Timer. At each shutdown of the system, the value stored in the volatile memory of the status register 218 is transferred to the non-volatile memory and at each startup of the system, the value stored in non-volatile memory is transferred to the volatile memory.

The updates of the value stored in the status register 218 are regulated by a clock generator 222. In one embodiment, the clock generator 222 is a low-frequency generator, implemented as a frequency divider whose input is driven by a system clock signal. In a variant implementation, the low-frequency generator is implemented as a low-frequency oscillator, such as for example a circuit of NE555 type.

Figure 3:
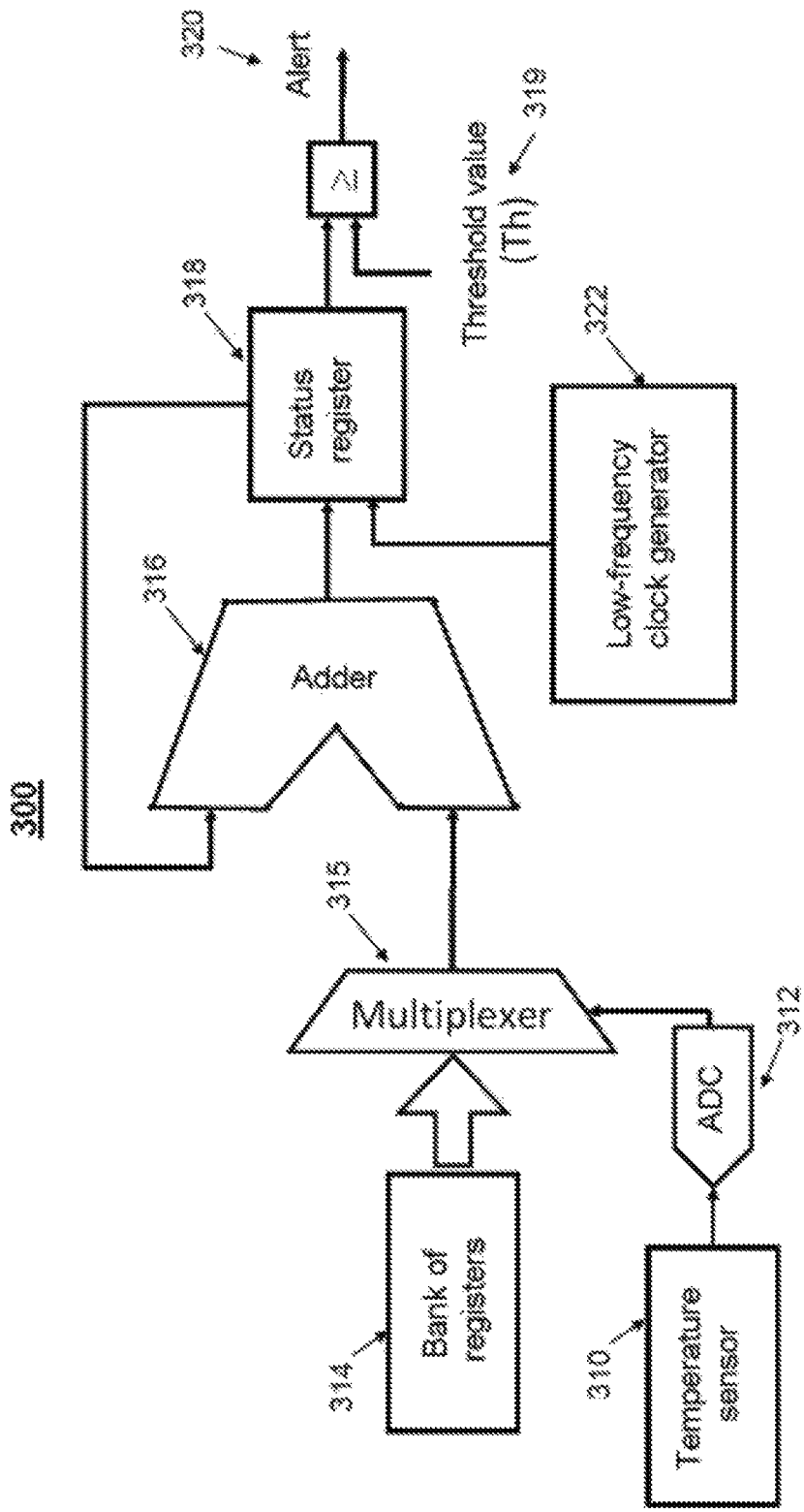
FIG. 3 illustrates a variant embodiment of the device of the invention.

FIG. 3 illustrates a variant of implementation of the device of the invention, described in FIG. 2, in which the encoder 214 is replaced with a bank of registers 314 coupled to a multiplexer 315. Thus, the device of FIG. 3 comprises a temperature sensor 310 coupled to an analog-digital converter ADC 312, an adder 316, a status register 318 and a clock generator 322.

The output of the ADC drives the multiplexer 315, which receives as input the outputs of the registers of the bank of registers 314. According to the value delivered by the ADC, the multiplexer selects a register from among the set of registers of the bank of registers 314. The value of the selected register is transferred as input to the adder 316. The adder also receives as input the value stored in the status register.

The status register 318 is adapted to generate an alert signal 320 each time a value stored in the status register is increased by an amount which exceeds a predefined threshold value (319). This threshold corresponds to the minimum retention time of the monitored memory block or blocks, or to a fraction of this time, for example a half or a third.

Thus, the emission of an alert signal 320 by the status register 318 is indicative of the imminence of a loss of data in one or more memories monitored by the temperature sensor.

Each register of the bank of registers 314 contains a value which can be transferred to the adder as a function of the output of the ADC. The variant of FIG. 3 renders the device of the invention programmable by to change the values of the registers of the register bank. Thus, advantageously, through the choice of the values in the bank of registers 314, the device of the invention can be easily adapted to other models for describing the evolution of the temperature and the impact on the retention time of flash memories, such as for example a model constructed by superposition of several Arrhenius curves.

Advantageously, the device of the invention can be adapted to monitor other types of memories, such as resistive memories or DRAM memories. Still advantageously, the device of the invention can operate for MLC or TLC flash memories of NAND type.

According to one embodiment, the bank of registers 314 can be implemented with two memory technologies simultaneously: a volatile memory technology, of DRAM or SRAM type, and a non-volatile memory technology, of ROM, EEPROM or Flash type. In operative mode, at each startup of the system, the values adapted to suit the operation of the A-Timer device according to the desired application are transferred from the non-volatile memory area to the volatile memory area of the bank of registers, where they can thereafter be selected according to the value delivered by the ADC 312 so as to be dispatched to the adder 316.

In another programmable variant of the A-Timer device, the set of functions of—reading the ADC, selecting an incrementation value, adding to the value of the status register—is carried out by a micro-processor or a microcontroller. The micro-processor is adapted to periodically read the output of the ADC (or the output of the temperature sensor in the case where it delivers a numerical value directly), to choose an incrementation value as a function of the value at the output of the ADC and to add this incrementation value to the value stored in the status register.

Figure 4:
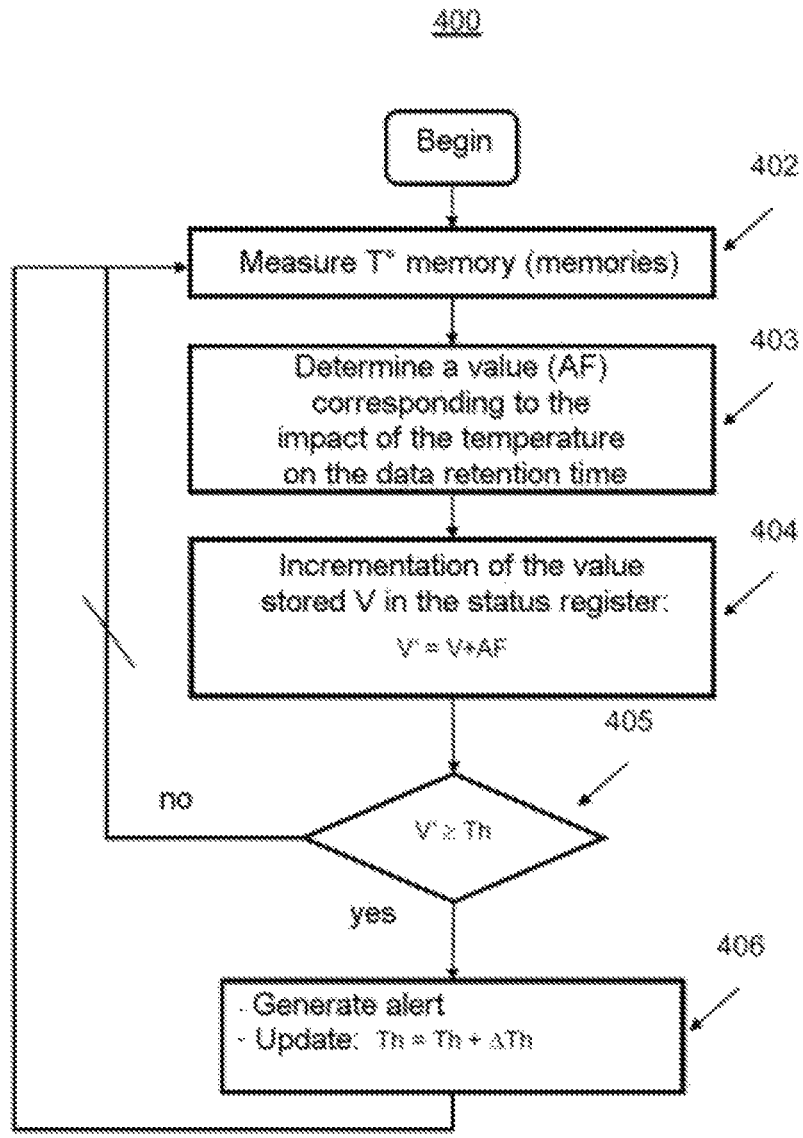
FIG. 4 shows a chain of steps for generating an alert according to an operative mode of the device of the invention.

FIG. 4 shows a chain of steps 400 to generate an alert according to an operative mode of the device of the invention. The method 400 begins with a step 402 of measuring the temperature of one or more memories. In a preferential implementation, the memory or memories are of flash memory type and the temperature measurement is taken by a temperature sensor assigned to the flash memory or memories of an SSD disk or of a memory card 110. In the following steps (403 to 405), the method makes it possible to detect whether a loss of data is imminent, and if so to generate 406 an alert, otherwise to loop back to the beginning.

The step of determining the imminent loss of data can be performed according to one of the previously described implementations of the device of the invention, where on the basis of the value of the measured temperature, a value (AF) proportional to the impact of the instantaneous temperature on the retention time of the memories is determined (403), and added (404) to the last value (V) stored in a status register. The resulting value (V') is thereafter compared (405) with a threshold value (Th), so as to give the indication of the imminence or otherwise of a loss of data. If the resulting value remains below the threshold value, signifying that there are no losses of data imminent, the method loops back to the beginning. If the resulting value is greater than the threshold value, signifying that a loss of data is imminent in the monitored memory or in one of the monitored memories, the method makes it possible (406) to generate an alert and to update the threshold value Th by increasing it by a value corresponding to the minimum retention time (or a fraction of this time) of the monitored memory block or blocks. The method can loop back to a new cycle.

With the emission of the alert signal, the method makes it possible to evaluate the retention time remaining for each memory block in the memory or memories concerned. According to one embodiment, the evaluation of the remaining retention time is undertaken by a microcontroller, such as the microcontroller 114 of the memory card 110. The alert signal generated by the status register of a given A-timer is dispatched to the microcontroller which evaluates the retention time remaining for each memory block or page of the memory or memories having valid data.

In one embodiment, the microcontroller compares the current state of the status register of the A-timer that generated the alert with the label of each block in the memories that are monitored by this A-timer. According to an implementation, the recording of the label of each memory block can be done after the first page programmed in a memory block which has just been erased.

If the difference between the current state of the status register and the label concerned of a memory block is greater than a given threshold, the method makes it possible to perform a refresh cycle for the data in the memory block considered, to pass to the following memory block so as to detect whether a loss of data is imminent. The threshold for triggering a data refresh cycle depends on the number of P/E cycles already performed on each memory block in the memories concerned.

Thus, advantageously, the device of the invention makes it possible to provide labels indicating a precise moment in time, and to identify the memory blocks whose stored data must be refreshed.

Figure 5:
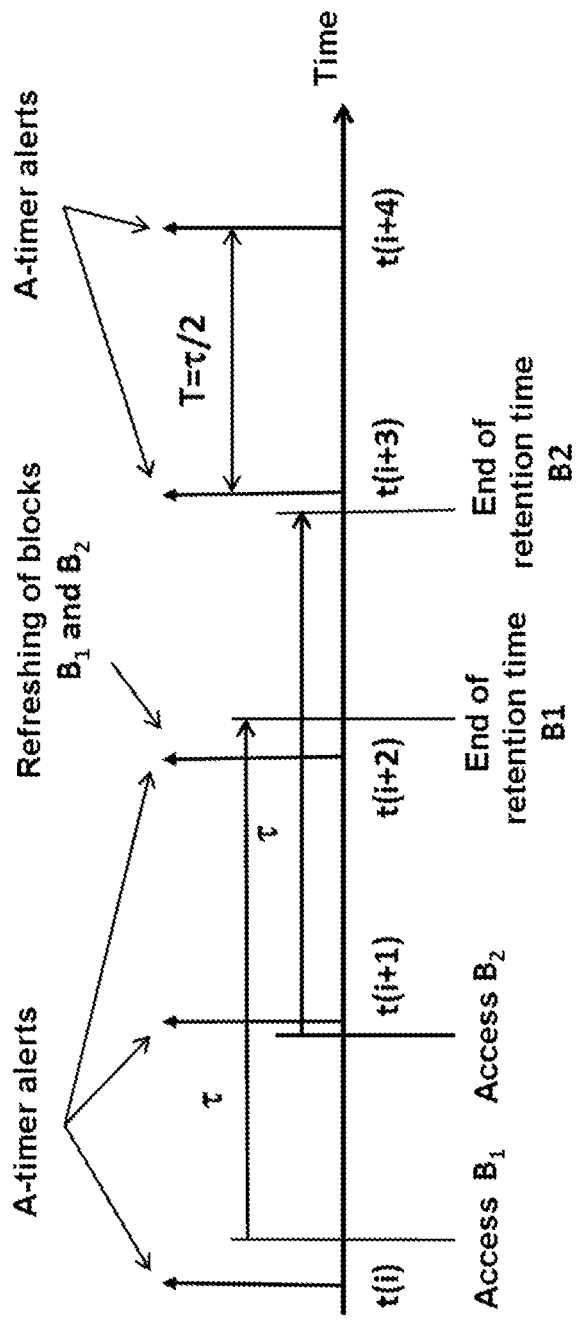
FIG. 5 illustrates on a time axis the generation of several alert signals which are or are not followed by a data refresh.

FIG. 5 illustrates on a time axis the generation of several alert signals which are or are not followed by a data refresh. As described previously, the states of the status register of the A-timer can be used as time labels associated with each block or with each page of a non-volatile memory. Following an alert, the device makes it possible to evaluate the difference between the current state of the status register and the label of each memory block. If for a memory block, the difference is greater than a given threshold, the data in the memory block considered must be refreshed. However, in order to prevent the data of all the blocks from being refreshed at each generation of an alert, the period 'T' between the alerts is chosen to be smaller than the minimum retention time of the data 'τ'. In the example illustrated, the period between the alerts is 'T=τ/2', for a retention time of two memory blocks (B1, B2) equal to 'τ'. With accesses to the two memory blocks programmed between two consecutive alerts generated at the times t(i) and t(i+1), the data must be refreshed just after the alert generated at the time t(i+2). It should be noted that the data of the memory block $B_1$ are refreshed just before their retention time is exhausted, whilst the data of the memory block $B_2$ are refreshed just after half their retention time. This illustrates that the effective storage time is smaller than the retention time by a value lying between 0 and T, and justifies the advantage of having as small as possible a period T between the alerts. When 'T=τ/n', each memory block must be refreshed every n alerts. This also makes it possible to consider memory blocks with different wear states, that is to say having a number of P/E cycles and of retention time that differ. Thus the device of the invention and its method can be applied to monitor the retention time of all the blocks of one or more non-volatile memories, even if these blocks contain heterogeneous data written at moments that are not correlated over time or if these blocks have different wear levels, e.g. number of different programming/erasure cycles (P/E). Certain memory blocks are configured to be refreshed every two alerts, as is shown in FIG. 5, whilst other memory blocks are configured to be refreshed every three or more alerts. Advantageously, the A-timer device makes it possible to establish a monitoring and refreshing policy over a duration which encompasses several alerts, due to the fact (i) that the status register of the A-timer is always incremented without ever being reset to zero and (ii) that an alert signal is generated each time the value stored in the status register is increased by an amount which exceeds a predefined threshold recalculated after generation of an alert signal. The present description illustrates a preferential implementation of the invention, but is not limiting. Examples are chosen to allow a proper understanding of the principles of the invention and a concrete application, but are in no way exhaustive and must allow the person skilled in the art to introduce modifications and variant implementations while retaining the same principles.

The invention can be implemented on the basis of hardware and/or software elements. It may be available as a program product.

The invention claimed is:

1. A device for controlling refresh cycles for refreshing data stored in non-volatile memory, the device comprising:
   a temperature sensor to measure a measured temperature of at least one non-volatile memory wherein said nonvolatile memory being composed of a plurality of memory blocks, and to deliver a value representative of the measured temperature; and
   a control module coupled to the temperature sensor, comprising:
   an encoder to transform the value representative of the measured temperature into a value proportional to an impact of the measured temperature on a data retention time in said at least one non-volatile memory; and
   an adder coupled to the encoder and to a status register, the adder receiving as input an output value of the encoder and a state value of the status register, the status register being configured to generate an alert signal each time the state value stored in the status register is increased by a predefined amount;
   the device further comprising a microcontroller coupled to the control module to receive the alert signal and to determine for each memory block of said at least one non-volatile memory, whether a data refresh cycle must be performed for said memory block, as a function of the data retention time remaining for said memory block.

2. The device as claimed in claim 1, wherein the control module comprises:
   a bank of registers to store values representative of a modeling of an evolution of the data retention time as a function of temperature;
   a multiplexer coupled to the bank of registers, to select as a function of an item of temperature information delivered by the temperature sensor a register in the bank of registers and deliver the value stored in said register; and
   the adder coupled to the multiplexer and to the status register, the adder receiving as input the value output by the multiplexer and the state value of the status register, the status register being configured to generate an alert signal each time the value stored in the status register is increased by a predefined amount.

3. The device as claimed in claim 1, wherein the remaining data retention time is calculated as a function of the number of programming/erasure cycles performed for said block.

4. The device as claimed in claim 1, wherein the modeling of the evolution of the data retention time as a function of temperature is based on an Arrhenius law.

5. The device as claimed in claim 1, wherein the temperature sensor is coupled to an analog-digital converter, and the item of temperature information is a numerical value delivered by the analog-digital converter.

6. The device as claimed in claim 5, wherein the analog-digital converter is a converter to deliver numerical values in the form of a "thermometer" code.

7. The device as claimed in claim 1, wherein the control module moreover comprises a clock generator.

8. The device as claimed in claim 7, wherein the clock generator is coupled to the status register so as to regulate updates of the value stored in the status register.

9. An SSD disk or a memory card comprising a microcontroller and a plurality of non-volatile memories, the SSD disk or the memory card moreover comprising at least one device as claimed in claim 1 for controlling refresh cycles of the plurality of the non-volatile memories.

10. The device as claimed in claim 1, wherein said at least one non-volatile memory is a flash memory.

11. A method for controlling refresh cycles for refreshing data stored in non-volatile memory, the method comprising the steps of:
    measuring a temperature of at least one non-volatile memory, said nonvolatile memory being composed of a plurality of memory blocks, and delivering a value representative of the measured temperature;
    using the value representative of the measured temperature with a modeling of an impact of the measured temperature on a data retention time to transform said value representative of the measured temperature into a value proportional to the impact of the measured temperature on the data retention time in said at least one non-volatile memory;
    adding said value proportional to the impact of the measured temperature on the data retention time in said at least one non-volatile memory to a state value of a status register;
    determining whether the resulting value is increased by a predefined amount; and
    if so generating an alert signal warning of imminent loss of data.

12. The method as claimed in claim 11, further comprising, after the generation of the alert signal, the steps of:
    evaluating the data retention time remaining in each block of said at least one non-volatile memory; and
    operating a refresh of the data in each block of said at least one non-volatile memory if its remaining data retention time is below a predefined threshold.

13. A program product, said program comprising non-transitory code instructions to perform the steps of the method as claimed in claim 11, when said program is executed on a micro-processor.

* * * * *